United States Patent
Liang et al.

(10) Patent No.: US 9,646,954 B2
(45) Date of Patent: May 9, 2017

(54) INTEGRATED CIRCUIT WITH TEST CIRCUIT

(75) Inventors: Shih-Wei Liang, Dajia Township (TW); Yu-Wen Liu, Taipei (TW); Hsien-Wei Chen, Sinying (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 1179 days.

(21) Appl. No.: 13/085,745

(22) Filed: Apr. 13, 2011

(65) Prior Publication Data

US 2012/0261662 A1 Oct. 18, 2012

(51) Int. Cl.
| | |
|---|---|
| H01L 23/58 | (2006.01) |
| H01L 29/10 | (2006.01) |
| H01L 25/065 | (2006.01) |
| H01L 21/66 | (2006.01) |
| H01L 23/522 | (2006.01) |
| H01L 23/00 | (2006.01) |

(52) U.S. Cl.
CPC .......... *H01L 25/0657* (2013.01); *H01L 22/34* (2013.01); *H01L 23/522* (2013.01); *H01L 24/14* (2013.01); *H01L 2224/0401* (2013.01); *H01L 2224/05022* (2013.01); *H01L 2224/05096* (2013.01); *H01L 2224/05572* (2013.01); *H01L 2224/14131* (2013.01); *H01L 2224/14179* (2013.01); *H01L 2224/14515* (2013.01); *H01L 2224/16145* (2013.01); *H01L 2225/06513* (2013.01); *H01L 2225/06596* (2013.01); *H01L 2924/00014* (2013.01)

(58) Field of Classification Search
CPC .......... H01L 22/14; H01L 22/32; H01L 22/34
USPC .............................. 257/48, E21.521, E23.179
See application file for complete search history.

(56) References Cited

U.S. PATENT DOCUMENTS

| | | | |
|---|---|---|---|
| 7,256,475 B2* | 8/2007 | Jao et al. ...................... | 257/622 |
| 7,622,309 B2* | 11/2009 | Su et al. ......................... | 438/14 |
| 2006/0292711 A1 | 12/2006 | Su et al. | |
| 2007/0023915 A1 | 2/2007 | Jao et al. | |
| 2009/0315029 A1* | 12/2009 | Kudo .............................. | 257/48 |

OTHER PUBLICATIONS

Office Action dated Apr. 1, 2014 from corresponding application No. CN 201110352628.4.

* cited by examiner

*Primary Examiner* — Jesse Y Miyoshi
(74) *Attorney, Agent, or Firm* — Hauptman Ham, LLP

(57) ABSTRACT

An integrated circuit system comprising a first integrated and at least one of a second integrated circuit, interposer or printed circuit board. The first integrated circuit further comprising a wiring stack, bond pads electrically connected to the wiring stack, and bump balls formed on the bond pads. First portions of the wiring stack and the bond pads form a functional circuit, and second portions of the wiring stack and the bond pads form a test circuit. A portion of the bump balls comprising dummy bump balls. The dummy bump balls electrically connected to the second portions of the wiring stack and the bond pads. The at least one of the second integrated circuit, interposer or printed circuit board forming a portion of the test circuit.

20 Claims, 7 Drawing Sheets

US 9,646,954 B2

INTEGRATED CIRCUIT WITH TEST CIRCUIT

BACKGROUND

An array of connectors placed on the top surface of an integrated circuit are used to make electrical connections between the integrated circuit and other integrated circuits, interposers or printed circuit boards. The connections are formed by bump balls at each connection point. The bump balls are formed of a solderable material that when heated forms a permanent connection with the other integrated circuit, interposer or printed circuit board. For an integrated circuit already connected to another integrated circuit, interposer or printed circuit board, separation of the integrated circuit from the other integrated circuit, interposer or printed circuit board is difficult and expensive, thereby causing the functional parts to become valueless because of the connection to the defective integrated circuit.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
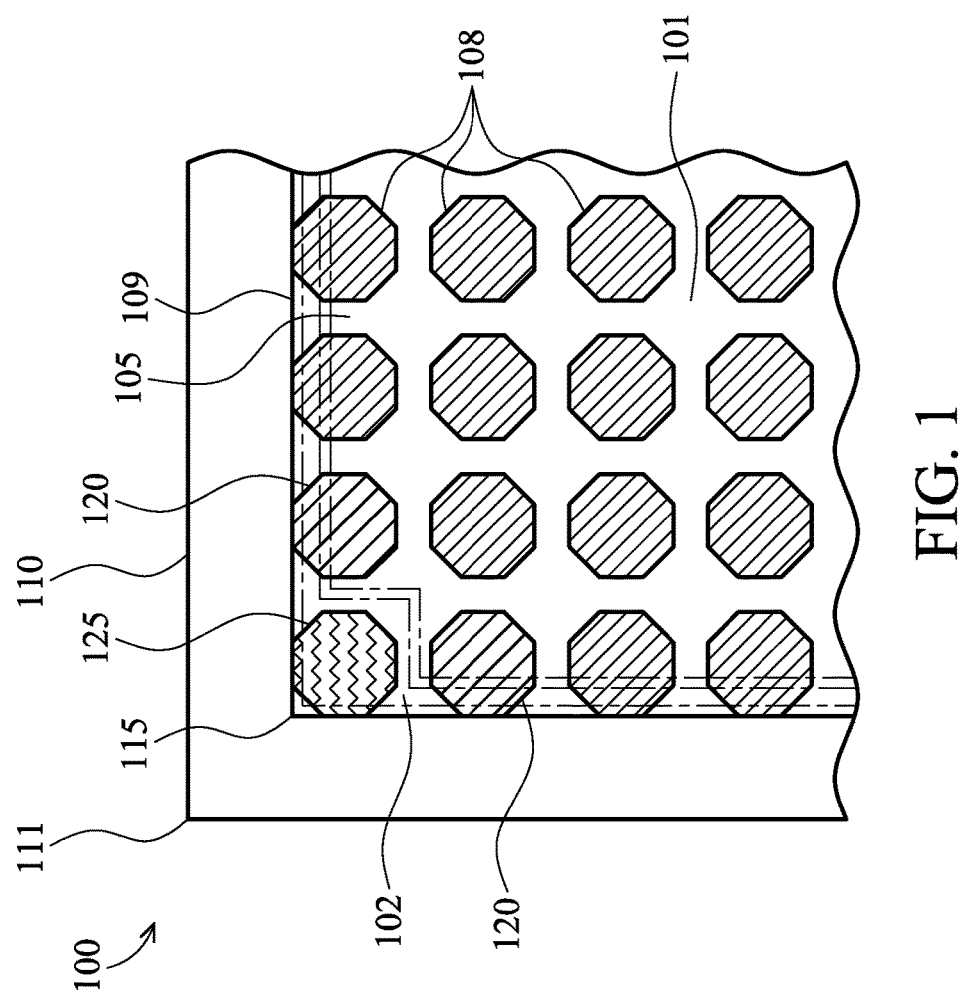
FIG. 1 is a top view of a corner portion of an integrated circuit according to an embodiment.

FIG. 1 is a top view of a corner portion of an integrated circuit 100 according to an embodiment. The integrated circuit 100 includes functional circuits 101 and test circuits 102. The functional circuits 101 comprise a plurality of semiconductor devices 103 (shown in FIG. 2), such as transistors, diodes, resistors and capacitors on a semiconductor substrate 104 (shown in FIG. 2). The functional circuit 101 is capable of operating the plurality of semiconductor devices in the integrated circuit 100 when the integrated circuit 100 is packaged in a product. The test circuit 102 does not contain semiconductor devices. The test circuit 102 is not used when the integrated circuit is in operation in a product.

An undoped silica glass (USG) layer 105 formed over the semiconductor substrate ends at an edge 109 before an edge 110 of the integrated circuit 100. Bump balls 108 are positioned on an upper surface of the integrated circuit 100 and are connected to a functional circuit 101 indicated by dashed lines and below the bump balls. The functional circuit 101 comprises circuitry that performs operations of the integrated circuit 100 when the integrated circuit is in operation in a product.

The corner 115 of the USG layer 105 is the most stressed portion of the integrated circuit 100. Dummy or redundant bump balls 125, 120 are placed in the corner portions of the integrated circuit 100. Redundant bump balls 120 connect power and signals, for example, power rails or ground rails for the integrated circuit 100 in addition to the power and signals being connected by a portion of bump balls 108. If the redundant bump balls 120 fail, for example, due to delamination of the USG layer 105 or layers formed under the USG layer, the power and signals remain connected to the integrated circuit 100 by the remaining portion of bump balls 108. A dummy bump ball 125 is placed next to the corner 115 of the USG layer 105. The dummy bump ball 125 is not used to connect any signals or power to the functional circuit 101 of integrated circuit 100. Thus, delamination of the USG layer 105 or layers formed under the USG layer within one bump ball distance of the corner 115 does not affect the operation of integrated circuit 100.

Although, the dummy bump ball 125 does not connect signals or power to integrated circuit 100, the dummy bump ball is connected to a test circuit 102 (indicated by dash-dot lines) positioned below the dummy bump ball 125.

In the embodiment of FIG. 1, one dummy bump ball 125 and two redundant bump balls 120 are positioned at each of the four corners 115 of the USG layer 105. Thus, the dummy bump balls 125 are positioned adjacent to a corner of the integrated circuit 100. In other embodiments, more than one dummy bump ball 125 and more or less than two redundant bump balls 120 are positioned at each of the four corners of the USG layer 115.

Figure 2:
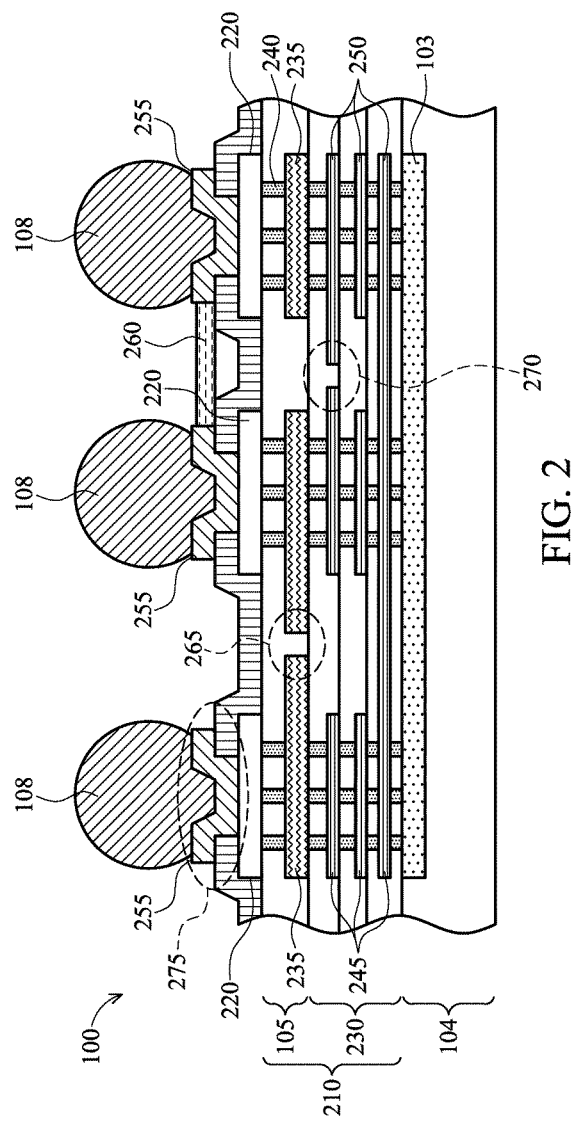
FIG. 2 is a cross-section view of the integrated circuit of FIG. 1.

FIG. 2 is a cross-section view of the integrated circuit 100, with the bump balls 108 formed above a wiring stack 210. The wiring stack 210 is formed on a substrate 104. The wiring stack 210 comprises bond pads 220 formed on the USG layer 105 which, in turn, is formed on extremely low K (ELK) dielectric layers 230. The integrated circuit 100 further comprises a metal layer 235 and vias 240 formed in USG layer 105. The integrated circuit 100 further comprises metal layers 245 and vias 250 formed within ELK dielectric layers 230. The vias 240 connect the bond pads 220 to the metal layer 235, and the vias 250 connect metal layers 245 to one another, to the metal layer 235 and to semiconductor devices 103 formed in the substrate 104.

The functional circuit 101 comprises a first portion of the wiring stack 210, bond pads 220 and the semiconductor devices 103 formed in the substrate 104. The bond pads 220 and first portion of the wiring stack 210 are electrically connect to semiconductor devices 103. In at least some embodiments, greater or fewer numbers of layers comprise wiring stack 210.

The test circuit 102 comprises a second portion of the wiring stack 210 (shown in FIG. 2), dummy bump balls 125 (shown in FIG. 1) and the corresponding bond pads 220. The second portion of the wiring stack 210 does not connect to the semiconductor devices 103 (shown in FIG. 2) and is electrically separate from the semiconductor devices 103. In one embodiment, the four dummy bump balls 125 (for clarity only one of which is shown in FIG. 1) are connected via vias and at least one of the metal layers 235, 245 and the vias 240, 250 to form portions of test circuit 102. Alternatively or in addition, dummy bump balls 125 are connected via bond pads 220 that are extended to short with one another to form portions of test circuit 102.

The first and second portions of the wiring stack 210 are, in some embodiments, separate wiring stacks.

The ELK dielectric layers 230 are more fragile than the USG layer 105. Thus, the USG layer 105 is used to protect the ELK dielectric layers from damage and delamination from the substrate 104. The bump balls 108 are formed from one or more materials that when heated will bond with portions of another integrated circuit, interposer or printed circuit board. Between the bump balls 108 and the bond pads 220, an under bump metallization 255 is formed as an interface between the bump ball metal and the bond pad metal. The under bump metallization 255 prevents cracking at the interface due to the formation of fragile alloys during bonding with another integrated circuit, interposer or printed circuit board.

Many possible defects may be introduced during fabrication of the integrated circuit 100. Shorts 260 may form between the under bump metallization 255. Shorts 265 may form between different wires in metal layer 235. Shorts 270 may form between wires formed in any of the metal layers 245. Vias 240, 250 may be malformed and, therefore, not make a connection between the bond pad 220, metal layer 235, metal layer 245 or substrate 104. Cracks 275 may form between the bump ball 108, the under bump metallization 255 and the bond pad 220. The USG layer 105, the bond pads 220 and ELK dielectric layers 230 may delaminate from each other or the substrate 104. If possible, these defects are detected before the defective device is bonded to any other device because this saves the expense of discarding a functioning device to which the defective device is bonded.

Other defects may be introduced after fabrication of the layers that form the integrated circuit 100. For example, after fabrication of the layers forming integrated circuit 100, a wafer on which the layers are formed is diced to form individual integrated circuit 100. The dicing process comprises sawing through the substrate and the layers that form the integrated circuit 100 to separate the individual integrated circuits 100. The sawing process causes stress, in particular at the edges of the integrated circuit 100. The stress may cause delamination of ELK dielectric layers 230 from one another or from the USG layer 105 causing the vias in the ELK dielectric layers 230 and USG layer 105 to separate from respective metal layers 245, 255.

Furthermore, handling of the integrated circuit 100 may cause delamination as discussed above, and further cause cracking of the interface between one or more of the metals and layers that form the integrated circuit. Therefore, fast and accurate methods for testing the integrity of the integrated circuit 100 before further processing are useful.

Figure 3:
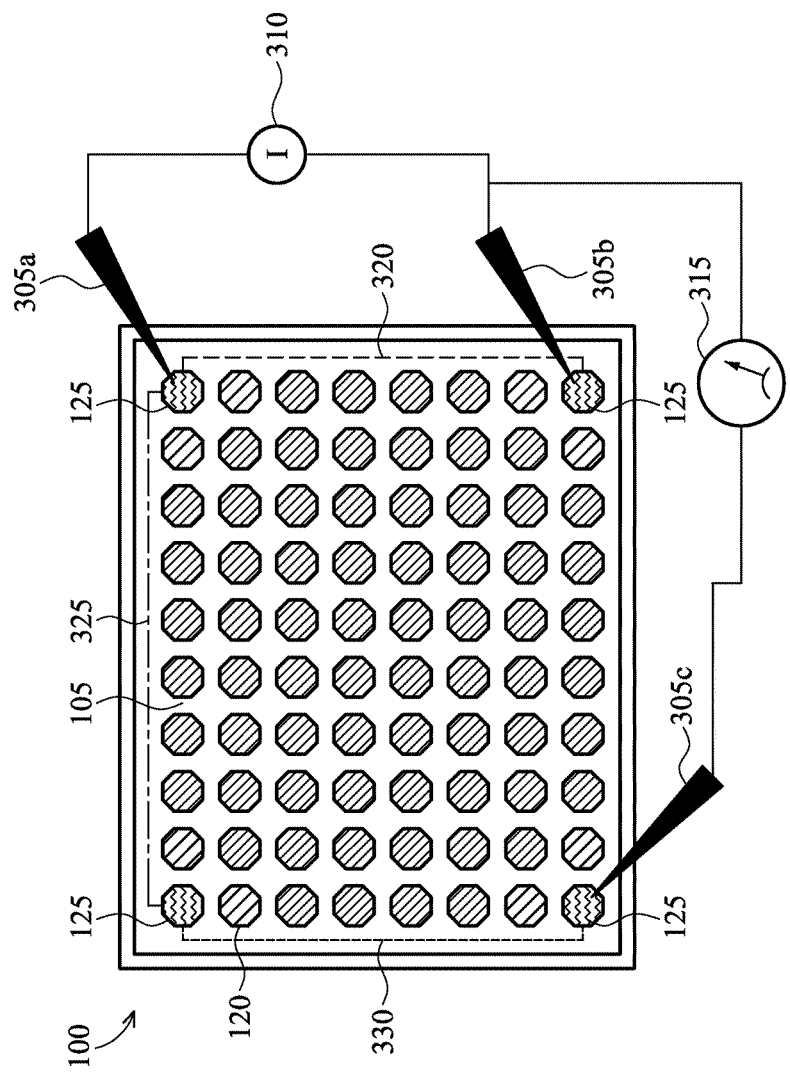
FIG. 3 is a top view of the integrated circuit of FIG. 1 under test.

FIG. 3 is a top view of an integrated circuit 100 under test, according to an embodiment. Three of the four dummy bump balls 125 are connected to probes 305a, 305b, 305c. A current source 310 is connected across two of the probes 305a and 305b. A voltmeter 315 is connected across the probes 305b and 305c.

To test integrated circuit 100 a three-point measurement is carried out. In the three-point measurement, the current from the current source 310 passes through the connected dummy bump balls connected to probes 305a, 305b and the connection formed in the wiring stack 210 or between shorted bond pads 220 (FIG. 2).

In the embodiment of FIG. 3, a first connection 320 is made by shorting bond pads 220 (FIG. 2), a second connection 325 is made in metal layer 235 (FIG. 2) and a third connection 330 is made in one of the metal layers 245 (FIG. 2) in the ELK dielectric layers 230. The connections 320, 325, 330 at the dummy bump balls 125 collectively form and are referred to as test circuit 102 (FIG. 1).

Based on the voltage detected by the voltmeter 315 in response to the current supplied by current source 310, information regarding the integrity of the dummy bump balls 125 and the connection formed in the wiring stack 210 or between shorted bond pads 220 is collected. After completion of the foregoing measurement, the probes are moved to connect to different ones of the dummy bump balls 125 and the measurement repeated until necessary combinations of the three probes connecting to the four dummy bump balls are completed.

Using all of the information collected from a combination of measurements, the integrity of each connection 320, 325, 330 between dummy bump balls and the connection between each bump ball and the underlying bond pad 220 is determined. If a defect is found, a decision is made as to whether the integrated circuit 100 may be bonded to another integrated circuit, interposer or printed circuit board.

Moreover, information collected from the combination of measurements is used to determine if layers in the wiring stack 210 are shorted when these layers should be open circuit or if the layers in the wiring stack 210 are shorted to the metal layer 235 or the bond pad 220. If a defect is found, a decision is made as to whether the integrated circuit 100 may be bonded to another integrated circuit, interposer or printed circuit board.

Which defects are detected by the above measurements depends upon the precise connections and layers of those connections between the dummy bump balls 125 on the integrated circuit 100. The defects are detected by comparing information collected from the combination of measurements with the known design of the connections between the four dummy bump balls 125.

In the embodiment shown in FIG. 3, a three-point measurement is performed. In other embodiments, a four-point measurement is performed in which a current is passed between two of the dummy bump balls 125, and a voltage is measured across the remaining two dummy bump balls. In some embodiments, combinations of measurements are performed to collect as much information as possible regarding the integrity of the dummy bump balls 125 and the connections between them. In other embodiments, only a portion of the measurements required to detect a particular defect are performed.

Figure 4:
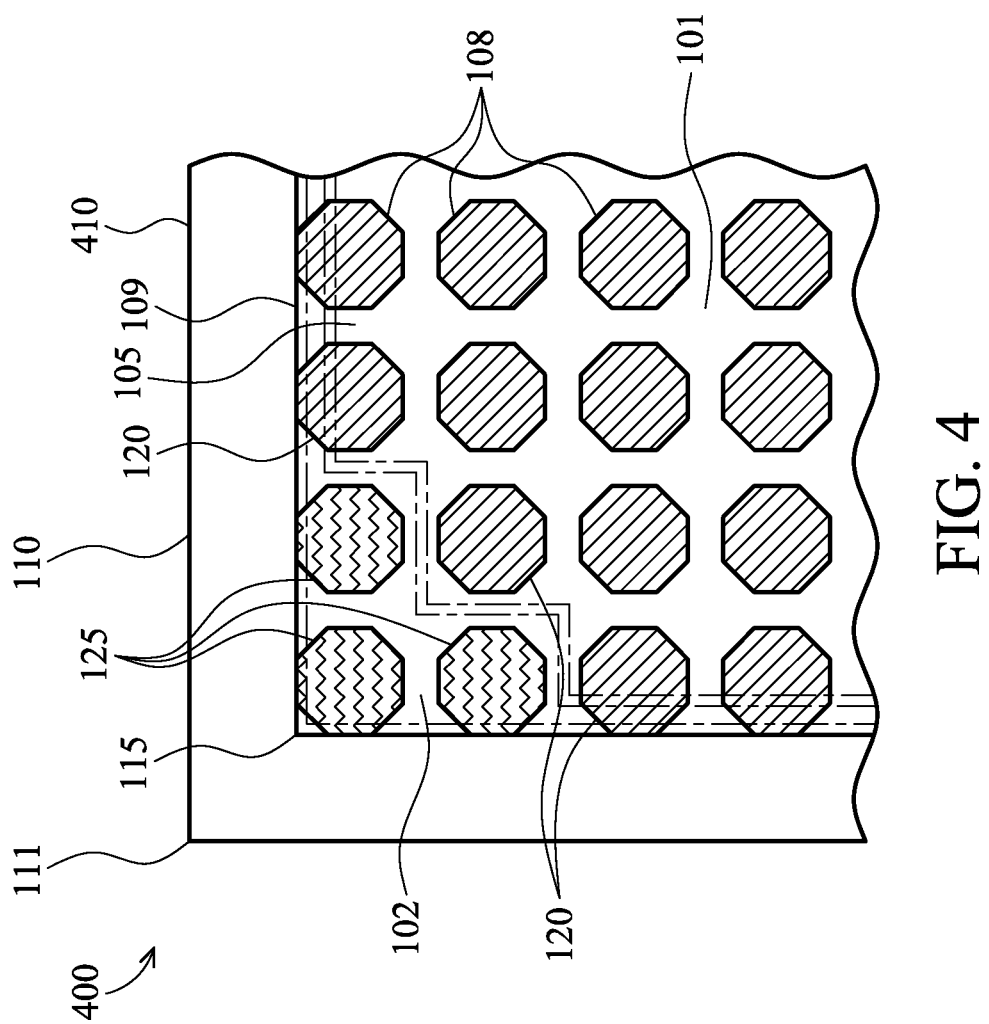
FIG. 4 is a top view of a corner portion of the integrated circuit according to another embodiment.

FIG. 4 is a top view of a corner portion of an integrated circuit 400 according to another embodiment. The embodiment of FIG. 4 is similar to the embodiment of FIG. 2 comprising the USG layer 105 ending at an edge 109 before the edge 410 of the integrated circuit 400. The embodiment of FIG. 4 further comprises bump balls 108 covering the top surface of the integrated circuit. The integrated circuit 400 has additional dummy bump balls 125 near the corners 115 and additional dummy or redundant bump balls 120 compared with the embodiment of FIG. 2. Therefore, a greater portion of the corner 115 may delaminate without affecting the integrity of the integrated circuit 400 because in operation none of the dummy or redundant bump balls are required for operation of integrated circuit 400. Integrated circuit 400 comprises a functional circuit 101 (indicated by the dashed line) connected to the bump balls 108 and test circuit 102 (indicated by the dash-dot lines) connected to the dummy bump balls 125.

As in the FIG. 1 embodiment, the dummy bump balls 125 are connected to portions of the wiring stack 210. In the FIG. 4 embodiment, three dummy bump balls 125 are positioned at each of the four corners of the USG layer 105. Thus, the three dummy bump balls 125 are disposed between a corner of the integrated circuit 100 and the remaining bump balls 108. The three dummy bump balls 125 at each corner of the USG layer 105 are connected via vias and at least one of the metal layers 235, 245 and the vias 240, 250 (FIG. 2). Alternatively, dummy bump balls 125 are connected via bond pads 220 (FIG. 2) that are extended to short with one another.

Figure 5:
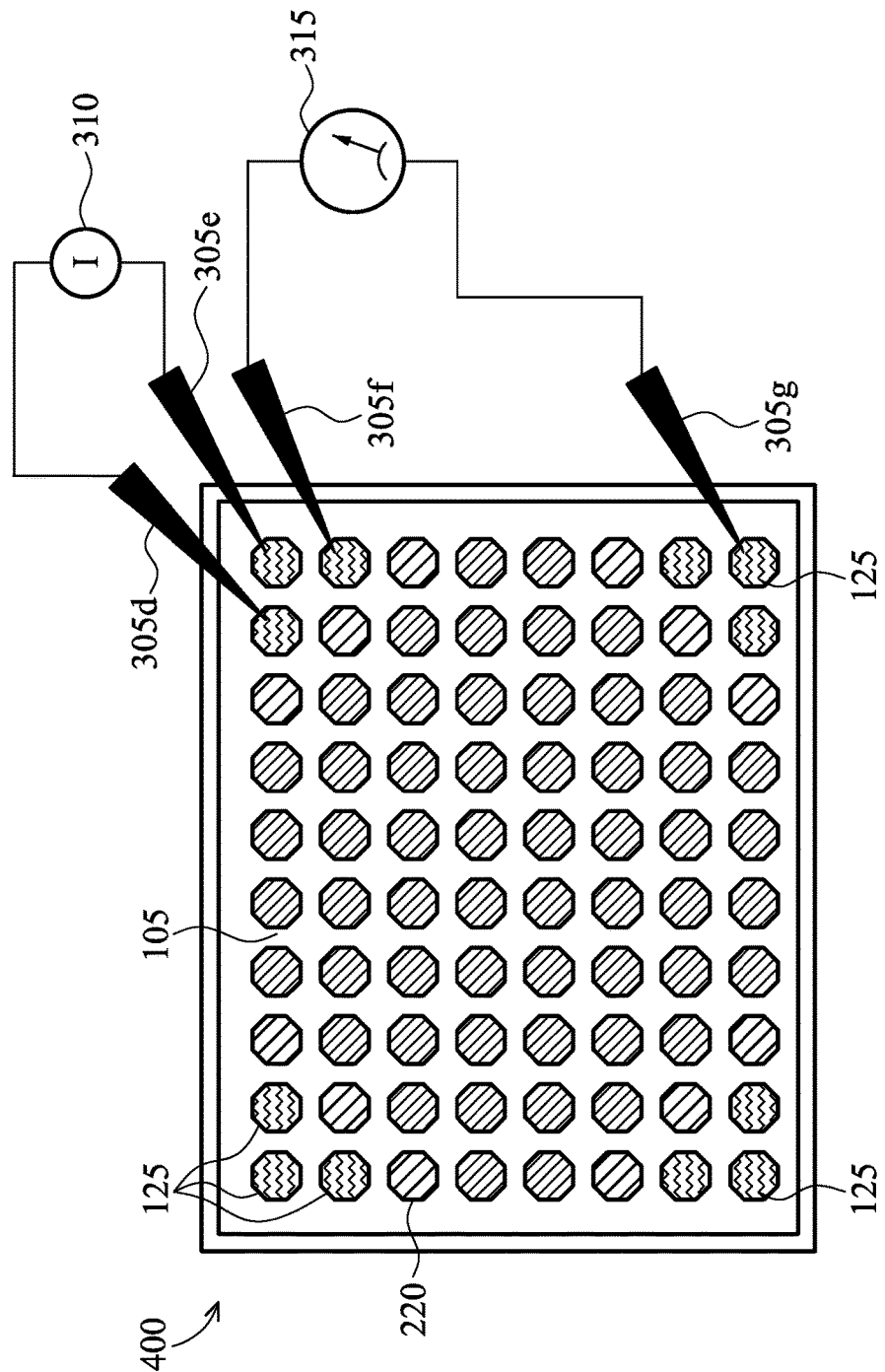
FIG. 5 is a top view of the integrated circuit of FIG. 4 under test.

FIG. 5 is a top view of the integrated circuit 400 under test. Three of the dummy bump balls 125 in the same corner and one dummy bump ball in another corner are connected to probes 305d, 305e, 305f, 305g. The current source 310 is connected across two of the probes 305d and 305e. The voltmeter 315 is connected across the probes 305f and 305g.

To test integrated circuit 400, a four-point measurement is carried. In the four-point measurement, the current from the current source 310 passes through the connected dummy bump balls connected to probes 305d, 305e and the connection formed in the wiring stack 210 or between shorted bond pads 220.

Based on the voltage detected by the voltmeter 315 in response to the current, information regarding the integrity of the dummy bump balls 125 and the connection formed in the wiring stack 210 or between shorted bond pads 220 is collected. After completion of the foregoing measurement, the probes are moved to connect to different ones of the dummy bump balls 125 and the measurement repeated until necessary combinations of the three probes connecting to the dummy bump balls 125 are completed.

Combinations of four-point measurement for the dummy bump balls 125 are performed for the dummy bump balls of the integrated circuit 400. Because there are three dummy bump balls 125 in each corner, additional combinations of test wiring between the dummy bump balls are designed into the integrated circuit 400, allowing a greater number of possible defects, either shorts or open circuits, to be detected based on the information gathered from the combinations of measurements performed on the integrated circuit 400 in comparison with the integrated circuit 100. In some embodiments, integrated circuit 400 is tested using combinations of three-point measurements.

In the embodiments of FIGS. 2-5, the dummy bump balls 125 are formed in the corners of the integrated circuit 100, 400. In other embodiments, the number of corner bump balls that are dummy bump balls 125 is any number of bump balls compatible with embodiments of the disclosure. In other embodiments, the dummy bump balls 125 are formed at additional/different positions of the integrated circuit 100, 400 compatible with embodiments of the disclosure. Further, the test structures connecting the bump balls 125 comprise additional test structures compatible with embodiments of the disclosure formed from the bond pads 220 and the wiring stack 210.

Figure 6:
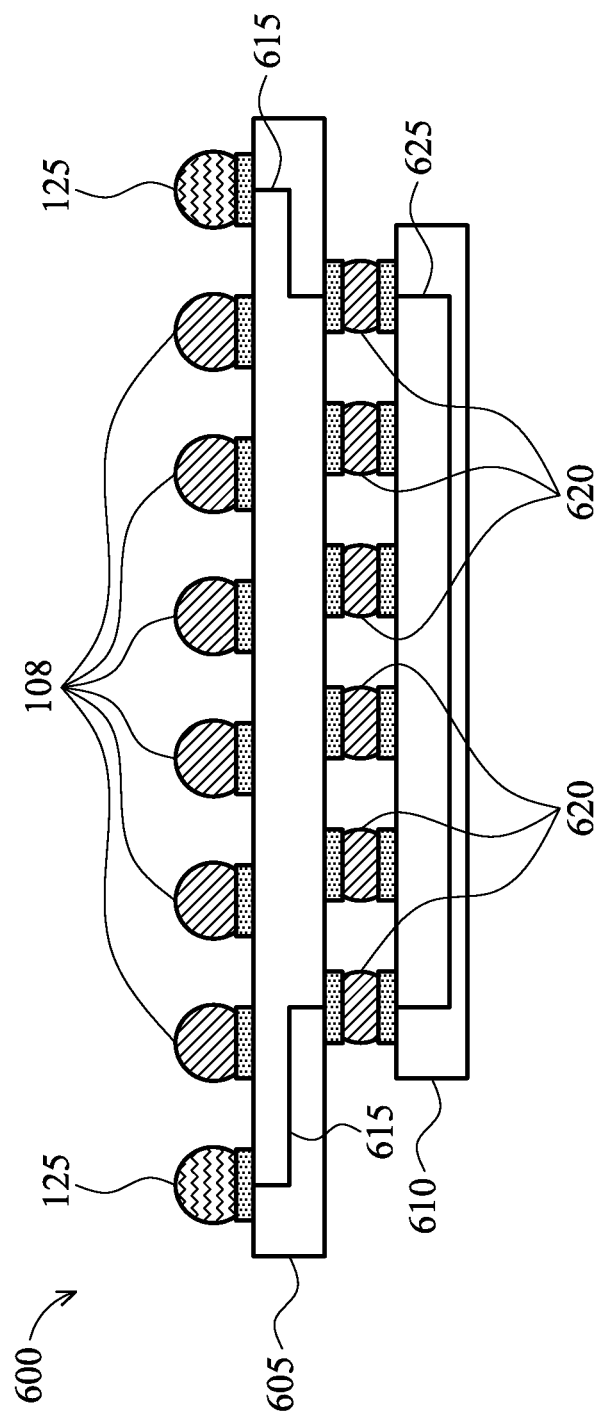
FIG. 6 is a side sectional view of an integrated circuit system comprising two integrated circuits die bonded together according to an embodiment.
Figure 7:
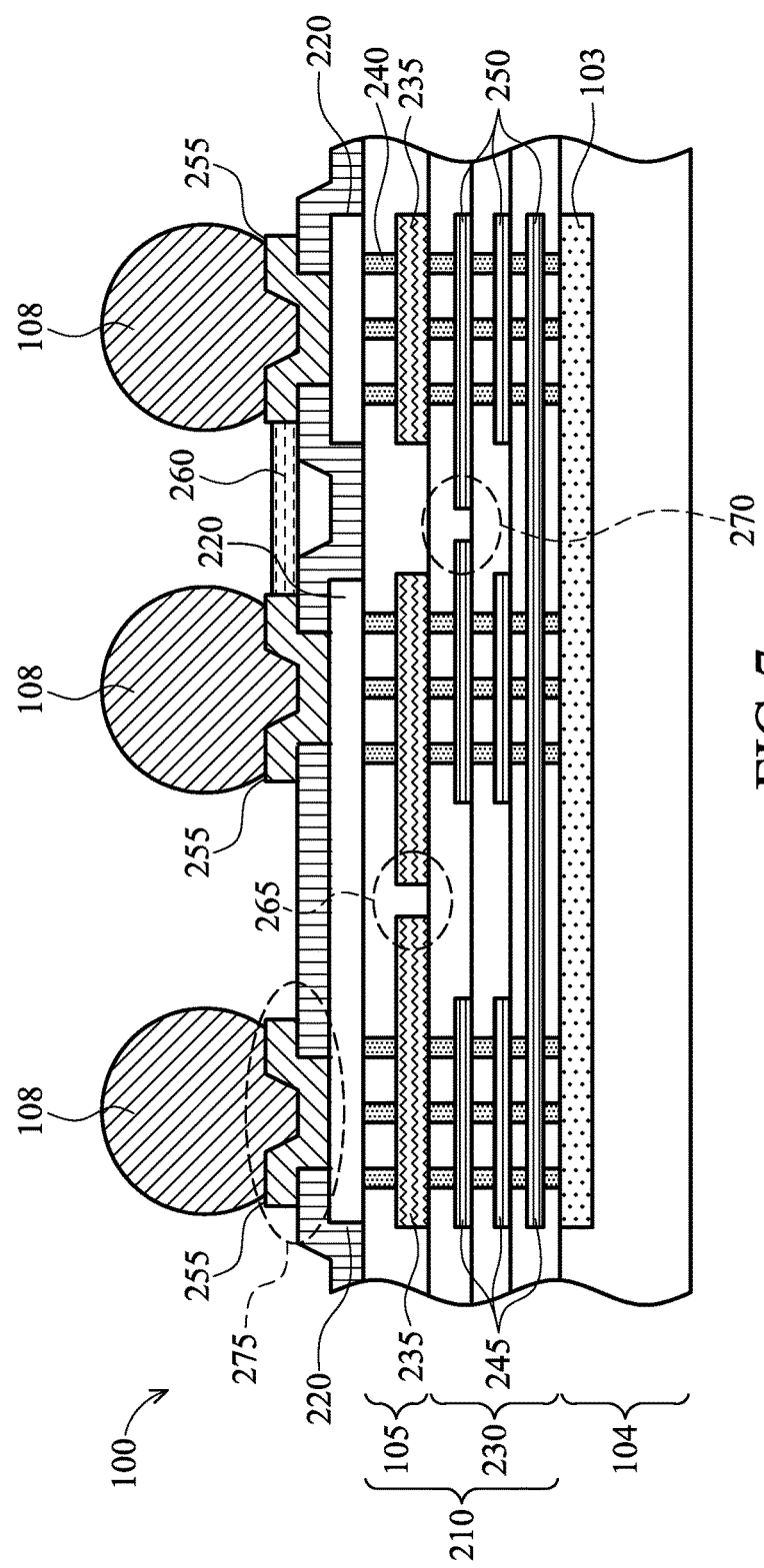
FIG. 7 is a cross-section view of the integrated circuit of FIG. 1, in accordance with some embodiments.

FIG. 6 is a side view of an integrated circuit system 600 comprising integrated circuits 605 and 610. Integrated circuit 605 is similar to integrated circuit 100 or integrated circuit 400, having dummy bump balls 125. The integrated circuit 610 is die bonded to integrated circuit 605. Before die bonding integrated circuit 610 to integrated circuit 605, the integrity of integrated circuit 605 is tested using the above-described methods for probing the dummy bump balls 125. The wiring stack of the integrated circuit 605 is configured to include connections 615 that connect the dummy bump balls 125 to connections on the integrated circuit 610. By making additional three-point or four point measurements on the bump balls 125 after the integrated circuit 610 is die bonded to the integrated circuit 605, the integrity of bump balls 620 and a wiring stack 625 formed in the integrated circuit 610 is tested by passing current and voltage for the three and/or four point measurements to the integrated circuit 610 via connections 615. In this manner, the integrity of the integrated circuit system 600 is evaluated before bonding the integrated circuit system 600 to other integrated circuits, interposers or printed circuit boards.

In some embodiments, the integrated circuit 610 is replaced by an interposer die bonded to integrated circuit 605. This allows bonding of the interposer and wiring in the interposer to be tested with three and/or four point measurements of the dummy bump balls 125 on integrated circuit 605 before the integrated circuit system is die bonded to another integrated circuit, interposer or printed circuit board. In some embodiments, the integrated circuit 610 is replaced by a printed circuit board die bonded to the integrated circuit 605. This allows bonding of the printed circuit board and wiring in the printed circuit board to be tested with three and four point measurements of the dummy bump balls 125 on integrated circuit 605 before the integrated circuit system is die bonded to another integrated circuit, interposer or printed circuit board.

In the embodiments of FIGS. 1-6, bump balls 108 are deposited on the bond pads 220. In other embodiments, a portion of the bond pads do not have bump balls but are wire bonded to other integrated circuits, interposers or printed circuit boards.

In some embodiments, the test circuit 102 is not electrically connected to the functional circuit 101. In other embodiments, the test circuit 102 is electrically connected to the functional circuit 101. In yet other embodiments, the test circuit is formed using portions of the functional circuit 101, bond pads 220 and bump balls 108 other than dummy bump balls 125.

According to some embodiments, an integrated circuit comprising a substrate, a functional circuit and a test circuit. The functional circuit comprising a semiconductor device formed on the substrate, a first wiring stack formed on the substrate, a first set of bond pads formed on the first wiring stack and a first set of bump balls. The first wiring stack electrically connected to the semiconductor device. Each bump ball of the first set of bump balls formed on a corresponding bond pad of the first set of bond pads. The test circuit comprising a second wiring stack formed on the substrate, a second set of bond pads formed on the second wiring stack, and a second set of bump balls. The second wiring stack separated from the semiconductor device Each bump ball of the second set of bump balls formed on a corresponding bond pad of the second set of bond pads and the second set of bump balls being a dummy bump balls.

According to some embodiments, an integrated circuit system comprising at least one of a first integrated circuit, interposer or printed circuit board and a second integrated circuit. The first integrated interposer or printed circuit board comprising a first portion of a test circuit. The second integrated circuit comprising a wiring stack, an array of bond pads, an array of bump balls, each bump ball formed on a corresponding bond pad and a second portion of the test circuit. The functional circuit comprising a first portion of the bump balls and a first portion of the bond pads. The second portion of the test circuit comprising a second portion of the bump balls and a second portion of the bond pads, each bump ball of the second portion of the bump balls being a dummy bump ball. The first portion of the test circuit electrically connected to the second portion of the test circuit.

According to some embodiments, a method of fabricating an integrated circuit comprising forming a functional circuit and forming a test circuit. The forming of the functional circuit comprising forming a semiconductor device on a substrate, forming a first wiring stack on the substrate, forming a first set of bond pads on the first wiring stack and forming a first set of bump balls. The first wiring stack electrically connected to the semiconductor device. Each bump ball of the first set of bump balls formed on a corresponding bond pad of the first set of bond pads. The forming of the test circuit comprising forming a second wiring stack on the substrate, forming a second set of bond pads on the second wiring stack and forming a second set of bump balls. The second wiring stack separate from the semiconductor device. Each bump ball of the second set of bump balls being a dummy bump ball and formed on a corresponding bond pad of the second set of bond pads.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. An integrated circuit comprising:
   a first substrate;
   a functional circuit comprising:
      a semiconductor device formed on the first substrate;
      a first wiring stack formed on the first substrate, the first wiring stack electrically connected to the semiconductor device;
      a first set of bond pads formed on the first wiring stack; and
      a first set of bump balls, each bump ball of the first set of bump balls formed on a corresponding bond pad of the first set of bond pads; and
   a test circuit comprising:
      a second wiring stack formed on the first substrate, the second wiring stack electrically separated from the semiconductor device;
      a second set of bond pads formed on the second wiring stack;
      a second set of bump balls, each bump ball of the second set of bump balls formed on a corresponding bond pad of the second set of bond pads, and the second set of bump balls being dummy bump balls;
      a first electrical connection between at least two bump balls of the second set of bump balls;
   a second substrate bonded to the first substrate; and
      a second electrical connection between the second substrate and the at least two bump balls of the second set of bump balls.
2. The integrated circuit according to claim 1, at least one of the dummy bump balls disposed between a corner of the integrated circuit and the first set of bump balls.
3. The integrated circuit according to claim 1, at least one of the dummy bump balls adjacent to a corner of the integrated circuit.
4. The integrated circuit according to claim 1, the first electrical connection between two of the dummy bump balls comprising the bond pads under the corresponding two dummy bump balls.
5. The integrated circuit according to claim 1, the first electrical connection between two of the dummy bump balls being at least one metal layer in the second wiring stack.
6. The integrated circuit according to claim 1, wherein the second substrate comprises at least one of a second integrated circuit, interposer or printed circuit board.

7. The integrated circuit according to claim 1, wherein the first and second sets of bump balls are part of an array of bump balls.
8. The integrated circuit according to claim 1, the test circuit adapted for a measurement of at least one of an integrity of the second wiring stack, an integrity of the second set of bond pads, or an integrity of a connection between the dummy bump balls and the second set of bond pads.
9. The integrated circuit according to claim 1, wherein the first and second wiring stacks comprise metal layers formed within ELK dielectric layers.
10. An integrated circuit system comprising:
   at least one of a first integrated circuit, interposer or printed circuit board;
   a second integrated circuit comprising:
      a wiring stack;
      an array of bond pads;
      an array of bump balls, each bump ball formed on a corresponding bond pad; and
      a functional circuit comprising a first portion of the bump balls and a first portion of the bond pads; and
   a test circuit comprising a second portion of the bump balls and a second portion of the bond pads electrically connected with a portion of the at least one of a first integrated circuit, interposer or printed circuit board, each bump ball of the second portion of the bump balls being a dummy bump ball, wherein a space between the test circuit and the functional circuit is free of a seal ring.
11. The integrated circuit system according to claim 10, the test circuit adapted for a measurement of at least one of an integrity of the second wiring stack, an integrity of the second portion of the bond pads, an integrity of a connection between the second portion of the bump balls and the second portion of the bond pads or an integrity of a connection between the test circuit and the at least one of the first integrated circuit, interposer or printed circuit board.
12. A method of fabricating an integrated circuit comprising:
   forming a functional circuit, the forming of the functional circuit comprising:
      forming a semiconductor device on a first substrate;
      forming a first wiring stack on the first substrate, the first wiring stack electrically connected to the semiconductor device formed on the first substrate;
      forming a first set of bond pads on the first wiring stack; and
      forming a first set of bump balls, each bump ball of the first set of bump balls formed on a corresponding bond pad of the first set of bond pads;
   forming a test circuit, the forming of the test circuit comprising:
      forming a second wiring stack on the first substrate, the second wiring stack electrically separate from the semiconductor device;
      forming a second set of bond pads on the second wiring stack; and
      forming a second set of bump balls, each bump ball of the second set of bump balls being a dummy bump ball and formed on a corresponding bond pad of the second set of bond pads; and
   bonding a second substrate to the first substrate, wherein the test circuit adapted to test a first electrical connection between at least two bump balls of the second set of bump balls, and to further test a second electrical connection between the second substrate and the at least two bump balls of the second set of bump balls.

13. The method according to claim 12, further comprising forming at least one of the dummy bump balls between the first set of bump balls and a corner of the integrated circuit.

14. The method according to claim 12, further comprising forming at least one of the dummy bump balls adjacent to a corner of the integrated circuit.

15. The method according to claim 12, the electrical connection between two of the dummy bump balls formed from the bond pads under the corresponding two dummy bump balls.

16. The method according to claim 12, the electrical connection between two of the dummy bump balls formed from at least one metal layer in the second wiring stack.

17. The method according to claim 12, wherein the second substrate comprises at least one of a second integrated circuit, interposer or printed circuit board.

18. The method according to claim 12, the test circuit adapted to further test a third electrical connection formed in at least one of a second integrated circuit, interposer or printed circuit board of the second substrate.

19. The method according to claim 12, the test circuit adapted for a three-point measurement of at least one of an integrity of the second wiring stack, an integrity of the second set of bond pads, or an integrity of a connection between the dummy bump balls and the second set of bond pads.

20. The method according to claim 12, the test circuit adapted for a four-point measurement of at least one of an integrity of the second wiring stack, an integrity of the second set of bond pads, or an integrity of a connection between the dummy bump balls and the second set of bond pads.

* * * * *